United States Patent [19]
Yoon et al.

[11] Patent Number: 6,121,146
[45] Date of Patent: Sep. 19, 2000

[54] METHOD FOR FORMING CONTACT PLUGS OF A SEMICONDUCTOR DEVICE

[75] Inventors: Bo-Un Yoon, Seoul; In-Kwon Jeong, Kyunggi-do; Won-Seong Lee, Seoul, all of Rep. of Korea

[73] Assignee: Samsung Electronics Co., Ltd., Suwon, Rep. of Korea

[21] Appl. No.: 09/092,021

[22] Filed: Jun. 5, 1998

[30] Foreign Application Priority Data

Jun. 11, 1997 [KR] Rep. of Korea ................ 97-24146
Apr. 25, 1998 [KR] Rep. of Korea ................ 98-14850

[51] Int. Cl.[7] ................................. H01L 21/302
[52] U.S. Cl. ................. 438/692; 438/697; 438/700; 438/706; 438/745
[58] Field of Search ................. 438/690, 691, 438/692, 697, 698, 704, 723, 722, 724, 745

[56] References Cited

U.S. PATENT DOCUMENTS

| | | | |
|---|---|---|---|
| 4,879,257 | 11/1989 | Patrick | 438/625 |
| 5,094,972 | 3/1992 | Pierce et al. | 437/67 |
| 5,124,780 | 6/1992 | Sandhu et al. | 357/67 |
| 5,773,314 | 6/1998 | Jiang et al. | 438/3 |
| 5,915,189 | 6/1999 | Sim | 438/397 |

FOREIGN PATENT DOCUMENTS

| | | |
|---|---|---|
| 0 305 691 | 3/1989 | European Pat. Off. |
| 0 540 444 | 5/1993 | European Pat. Off. |
| 0 621 630 A1 | 3/1994 | European Pat. Off. |
| 0 621 630 A1 | 10/1994 | European Pat. Off. |
| 0 660 393 | 6/1995 | European Pat. Off. |
| 0 774 777 A1 | 5/1997 | European Pat. Off. |
| 0 722 1292 | 8/1995 | Japan. |
| WO 89/503 | 1/1989 | WIPO. |
| WO 89/05038 A1 | 6/1989 | WIPO. |

OTHER PUBLICATIONS

"Diamond–Like Films as a Barrier to Chemical–Mechanical Polish" IBM Technical Disclosure Bulletin, vol. 35, No. 1B, Jun. 1, 1992, pp. 211–213.

*Primary Examiner*—Benjamin L. Utech
*Assistant Examiner*—Lan Vinh
*Attorney, Agent, or Firm*—Jones Volentine, LLC

[57] ABSTRACT

A method for forming contact plugs of a semiconductor device includes a step of forming a conductive layer on an insulating layer filling up a contact hole. The method further comprises a step of planarization-etching an upper surface of the insulating layer as well as the contact plugs, after formation of the contact plugs by etching the conductive layer using an etch-back or a CMP process until at least the upper surface of the insulating layer is exposed. Alternatively, the conductive and insulating layers are simultaneously planarization-etched using a CMP process once to form the contact plugs and planarize the upper surface of the insulating layer. With this method, a bridge between interconnections which can be generated due to a scratch of the upper surface of the insulating layer can be prevented by planarization-etching the conductive layer after filling up a contact hole with the conductive layer. Also, since the insulating layer includes a lower insulating layer and an upper insulating layer having a relatively high hardness to the lower insulating layer, high-step and low-step regions of the insulating layer formed along topology of a gate electrode or a metal interconnection are efficiently planarized. As a result, a thickness of the insulating layer can be considerably reduced.

21 Claims, 6 Drawing Sheets

METHOD FOR FORMING CONTACT PLUGS OF A SEMICONDUCTOR DEVICE

FIELD OF THE INVENTION

The present invention relates to a method for fabricating a semiconductor device, and more particularly to a method for forming contact plugs of a semiconductor device capable of preventing a bridge between interconnections on the contact plugs.

BACKGROUND OF THE INVENTION

With the increase in high integration degree of semiconductor devices, multi-layer interconnection technologies are increasingly required.

To secure a photolithography process margin and minimize a length of interconnection in such multi-layer interconnection technologies, an insulating layer and a conductive layer which are formed on a semiconductor substrate should be planarized. If they are not planarized, interconnections may be frequently made open or short due to serious topology.

For this reason much effort has been dedicated to planarizing the insulating and conductive layers to form a contact plug.

Figure 1A:
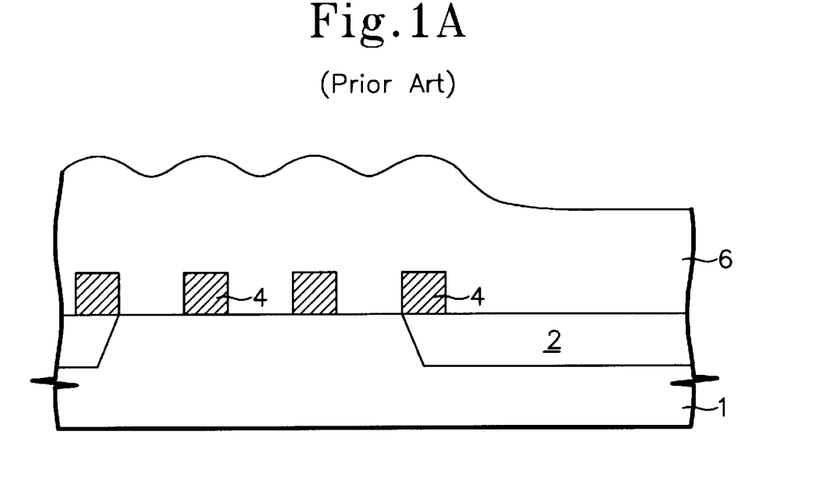
FIG. 1a through FIG. 1d are flow diagrams showing process steps of a prior art method for forming contact plugs of a semiconductor device.

FIGS. 1a through 1d show process steps of a prior art method for forming contact plugs. Referring to FIG. 1a, a gate electrode 4, for example, a word line of a semiconductor memory device is formed on a semiconductor substrate 1 in which a device isolation layer 2 is formed. An insulating layer 6 of oxide is deposited over the semiconductor substrate 1 including the gate electrode 4. The oxide layer 6 has an uneven surface following the topology of the gate electrode 4. Also, two regions having a step with each other are generated on the insulating layer 6, one of which is a high-step region where the gate electrode 4 is formed, and the other of which is a low-step region wherein the gate electrode is not formed.

Figure 1B:
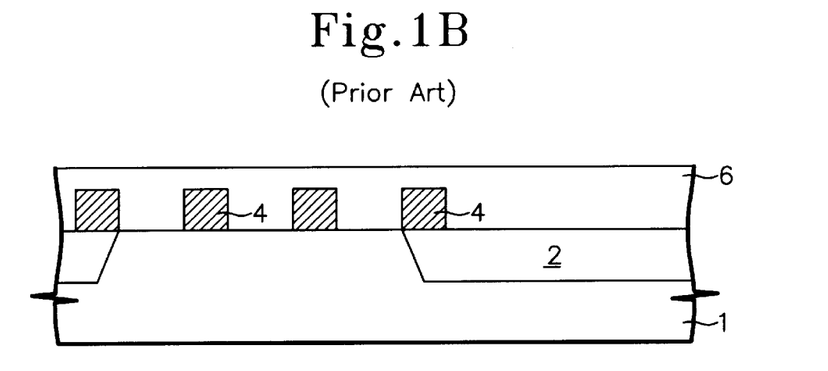

Next, when an etching of the insulating layer 6 having the uneven surface is performed using a CMP (chemical mechanical polishing) process, the upper surface of the insulating layer 6 can be planarized as shown in FIG. 1b.

Figure 1C:
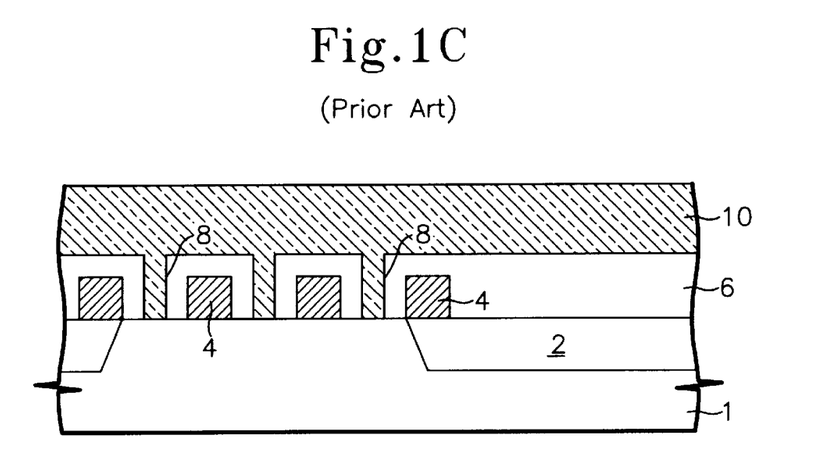

With reference to FIG. 1c, the planarized insulating layer 6 is also etched until a diffusion region (not shown) on the semiconductor substrate 1 is exposed, and thereby a contact hole 8 is formed. Subsequently, a conductive layer 10 of, for example, polysilicon is deposited on the insulating layer 6 filling up the contact hole 8.

Figure 1D:
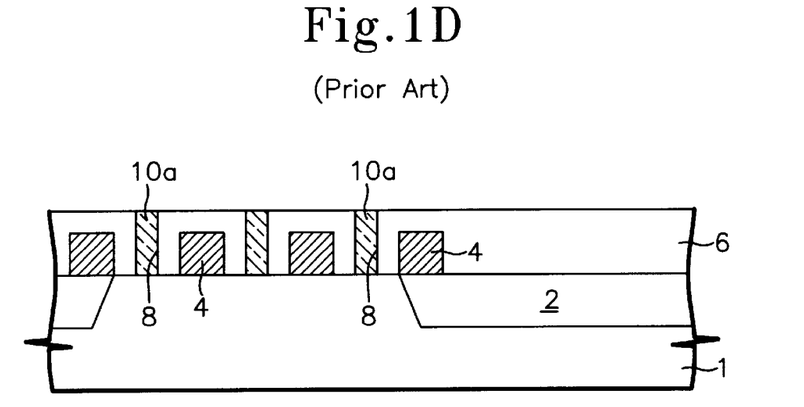

Finally, as shown in FIG. 1d, a CMP process is performed to etch the conductive layer 10 until the upper surface of the insulating layer 6 is exposed, and thereby a contact plug 10a of polysilicon is formed.

Herein, we should give attention to the fact that in the prior art method the CMP process of the insulating layer 6 is first performed before the formation of the contact plug 10a, and thereby a scratch is generated on the insulating layer 6 during the CMP process. This scratch on the insulating layer 6 may lead to a bridge between interconnections to be formed on the contact plug when a conductive material is formed in the scratch. Also, the insulating layer 6 should be deposited enough to cover the gate electrode 4 and assure surface planarization of the insulating layer. Thus, a sufficient time is required for the planarization/etching of the insulating layer. This leads to decrease in a fabrication yield of semiconductor devices.

In brief, the prior art method for forming contact plugs leads to two problems: first, microscrach and pitting on the insulating layer 6 are generated due to polishing during CMP process thereof. This problem may cause a bridge to form between interconnections to be formed by a following metallization. Second, a thickness of an insulating layer for planarization becomes more difficult to be reduced. As a result of these problems the fabrication process may have a decrease in reliability and yield.

SUMMARY OF THE INVENTION

The present invention is intended to solve the problems, and it is an object of the invention to provide a method for forming contact plugs of a semiconductor device without a bridge between interconnections.

It is another object of the present invention to provide a method for forming contact plugs of a semiconductor device whose insulating layer has a lower insulating layer and an upper insulating layer having a relatively high hardness to the lower insulating layer so as possible to efficiently planarize a high-step and a low-step region.

According to an aspect of the present invention, there is provided a method for forming contact plugs of a semiconductor device, which comprises the steps of forming a conductive structure on a semiconductor substrate having a plurality of diffusion regions therein; forming an insulating layer on the semiconductor substrate including the conductive structure; etching the insulating layer until at least one of the diffusion regions is exposed, to form a contact hole; depositing a conductive layer on the insulating layer filling up the contact hole with the conductive layer; etching the conductive layer until an upper surface of the insulating layer is exposed, to form a contact plug; and etching an upper surface of the insulating layer including the contact plug by means of a planarization-etching process, wherein both upper surfaces of the contact plug and the insulating layer are planarized.

According to another aspect of the present invention, there is provided a method for forming contact plugs of a semiconductor device, which comprises the steps of forming a conductive structure on a semiconductor substrate having a plurality of diffusion regions therein; sequentially forming first and second insulating layers on the semiconductor substrate including the conductive structure, said second insulating layer having a relatively high hardness to the first insulating layer; sequentially etching the second and first insulating layers until at least one of the diffusion regions and the conductive structure is exposed, to form a contact hole; forming a conductive layer on the second insulating layer filling up the contact hole; and etching the conductive layer until at least an upper surface of the second insulating layer is exposed, to form a contact plug; and planarization-etching the second and first insulating layers including the contact plug. The second insulating layer is etched at a speed slower than a low-step portion of the second insulating layer where the conductive structure and the contact hole are not formed, and than the first insulating layer, during the planarization-etching step.

According to another aspect of the present invention, there is provided a method for forming contact plugs of a semiconductor device, which comprises the steps of forming a conductive structure on a semiconductor substrate having a plurality of diffusion regions therein; sequentially forming first and second insulating layers on the semiconductor substrate including the conductive structure, said second insulating layer having a relatively high hardness to the first insulating layer; etching the second and first insulating layers until an upper surface of the conductive structure is exposed, to form a contact hole; forming a conductive layer on the second insulating layer filling up the contact hole; and sequentially planarization-etching the conductive, second insulating, and first insulating layers to form a contact plug and a planarized surface of the first insulating layer. The second insulating layer is etched at a speed slower than a low-step portion of the second insulating layer where the conductive structure and the contact hole are not formed, and than the first insulating layer.

Each of the methods as mentioned above further comprises, before formation of the conductive layer, forming a barrier layer on the insulating layer including the contact hole.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

The present invention will be described with reference to sample preferred embodiments, but it must be recognized that the present invention can be widely modified and varied, and the scope of the present invention is not limited except as set forth in the accompanying claims.

Figure 2A:
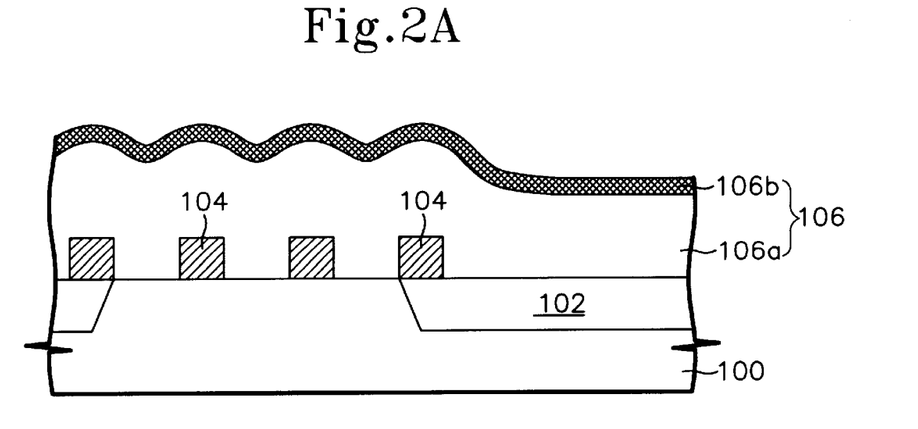
FIGS. 2a through 2e are flow diagram showing process steps of a novel method for forming contact plugs of a semiconductor substrate according to a first embodiment of the present invention.
Figure 2B:
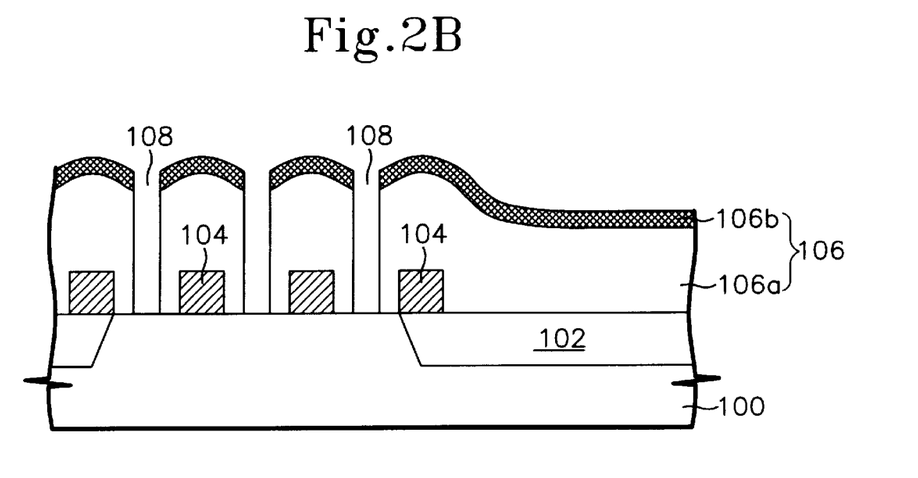
Figure 2C:
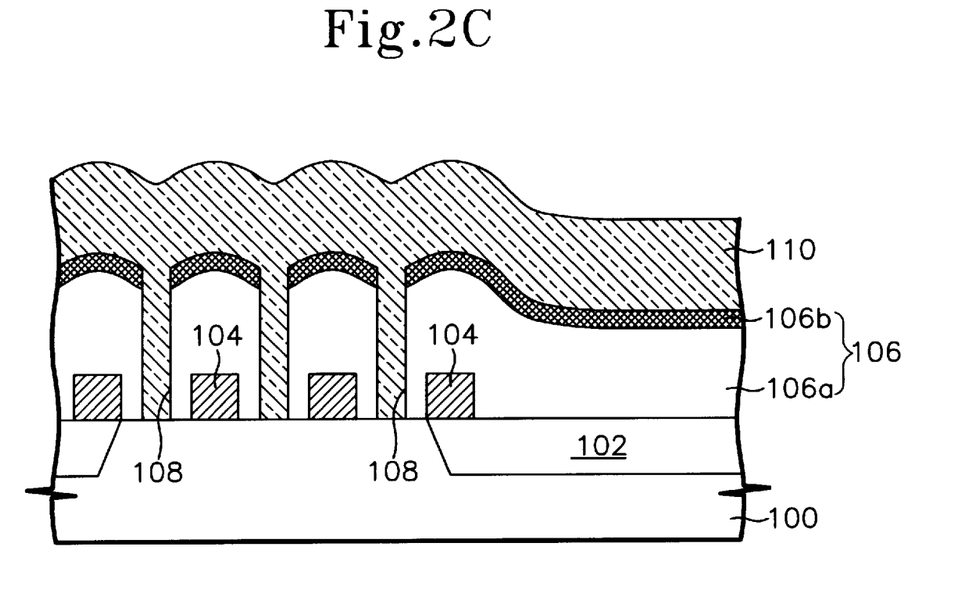
Figure 2D:
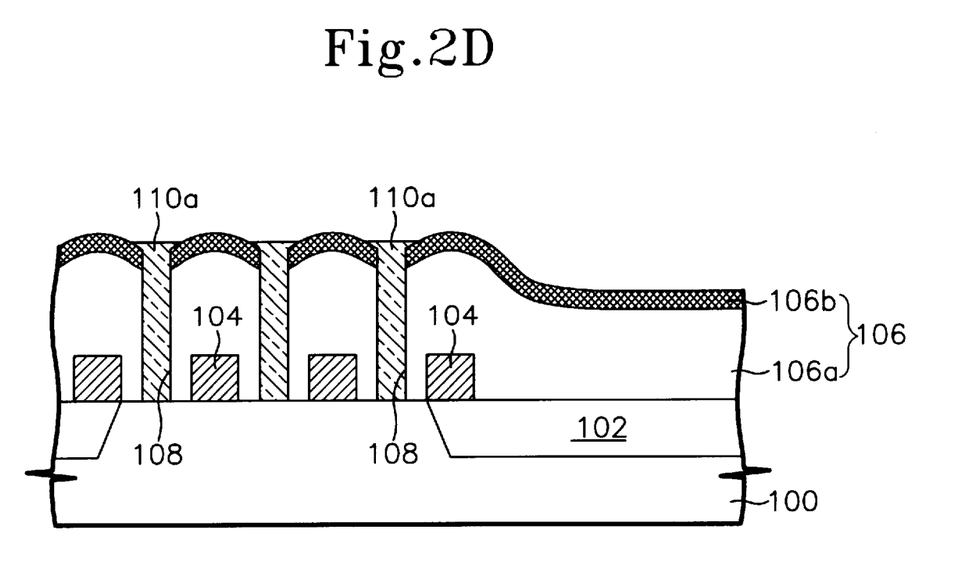
Figure 4A:
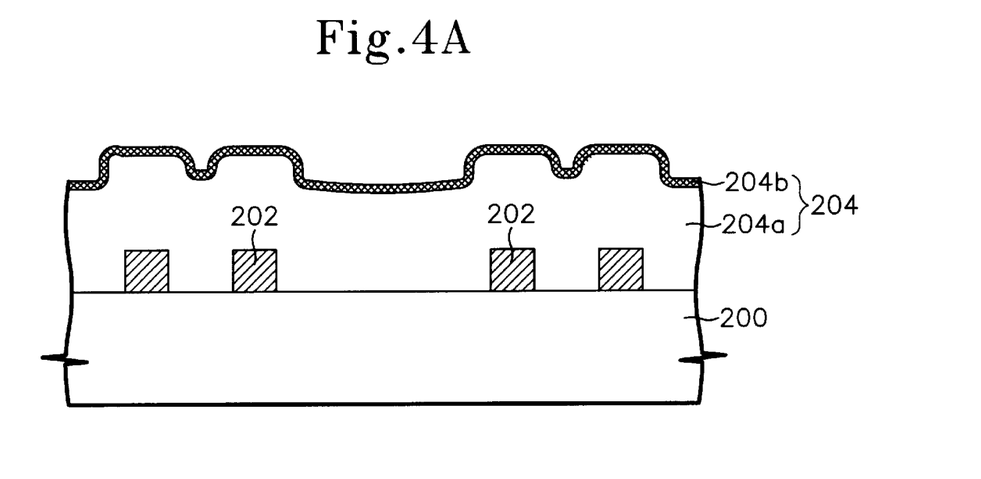
FIGS. 4a through 4e are flow diagram showing process steps of a novel method for forming contact plugs of a semiconductor substrate according to a second embodiment of the present invention.
Figure 4B:
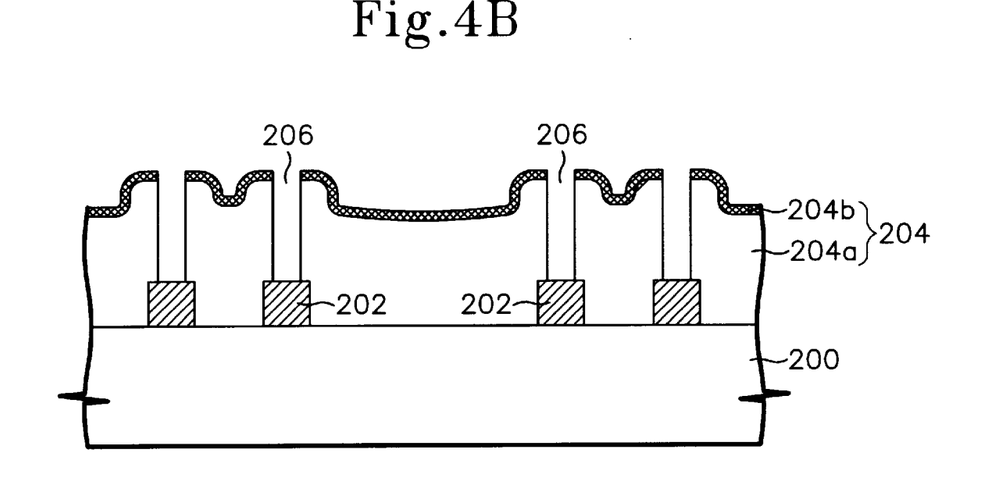
Figure 4C:
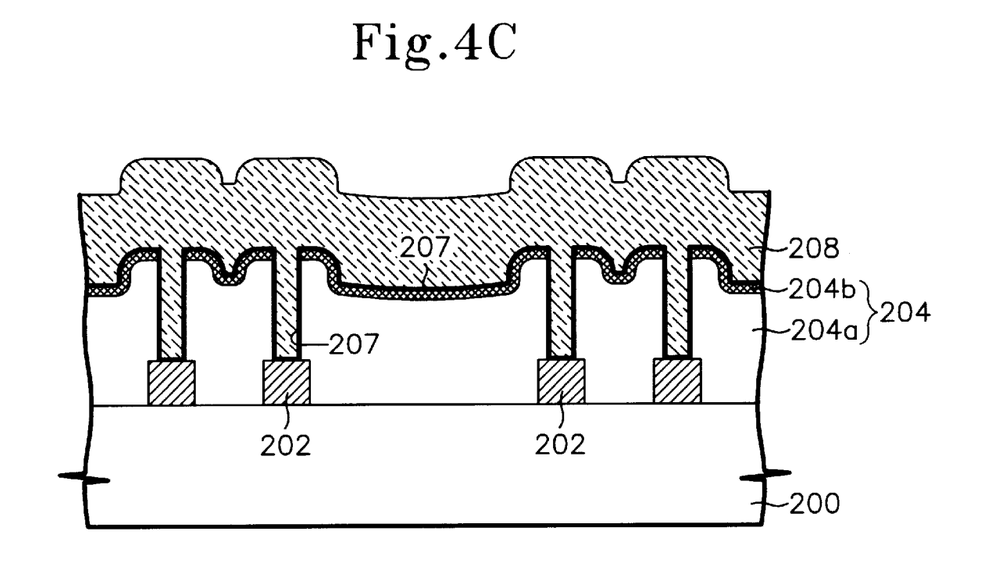
Figure 4D:
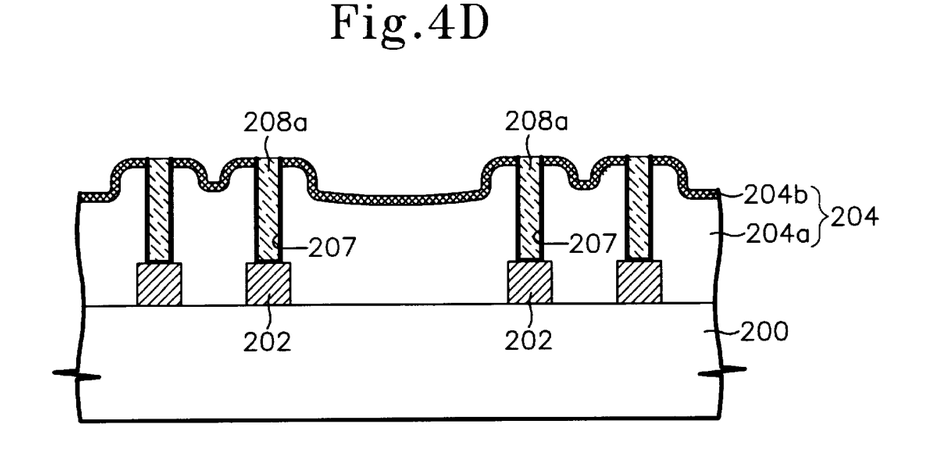

Referring to FIGS. 2d and 4d, a novel method for forming contact plugs of a semiconductor device in accordance with the present invention includes a step of forming a conductive layer on an insulating layer filling up a contact hole. The method further comprises a step of planarization/etching an upper surface of an insulating layer as well as the contact plugs after formation of the contact plugs by etching the conductive layer using an etch-back or a CMP process until at least the upper surface of the insulating layer is exposed. Alternatively, the conductive and insulating layers are simultaneously planarized/etched using a CMP process once to form the contact plugs and to planarize the upper surface of the insulating layer. With this method, a bridge between interconnections which can be generated due to a scratch of the upper surface of the insulating layer can be prevented by planarizing/etching the conductive layer after filling up a contact hole with the conductive layer. Also, since the insulating layer includes a lower insulating layer and an upper insulating layer having a high hardness relative to the lower insulating layer, high-step and low-step regions of the insulating layer formed along topology of a gate electrode or a metal interconnection are efficiently planarized. As a result, a thickness of the insulating layer can be considerably reduced

EMBODIMENT 1

Now, a method for forming contact plugs of a semiconductor memory device according to a first embodiment of the present invention will be described with reference to FIGS. 2 and 3. These figures show a first embodiment of the invention.

Referring to FIG. 2a, a semiconductor substrate 100, for example, a silicon substrate, has had a device isolation layer 102 (in this case field oxide region) patterned to define active and inactive regions. In the embodiment of FIG. 2a, the device isolation layer 102 has the characteristic shape of an STI (shallow trench isolation) field oxide, but the present invention can of course be practiced using other isolation technologies, such as LOCOS field oxide, sidewall mask isolation or direct field isolation. A gate electrode 104, for example, a word line of the semiconductor memory device, is formed on the silicon substrate 100. This silicon substrate includes diffusion regions (not shown), for example, source/drain regions formed in the active regions at both sides of the gate electrode 104.

Next, an insulating layer (or an interlayer insulating layer) 106 is deposited over the silicon substrate 100 including the gate electrode 104 so as to permit electrical insulation between interconnections. The insulating layer 106 can comprise a material selected from a group consisting of $SiO_2$, USG (undoped silicate glass), BPSG, PSG (phospho silicate glass), SiN, SiON, SiOF, SOG (spin on glass), FOX (flowable oxide), polymer, and a combination of these materials. Preferably, the insulating layer 106 has a multi-layer film, that is, a lower insulating layer 106a and an upper insulating layer 106b which have different hardness with respect to each other. The lower insulating layer 106a is made of an oxide layer which preferably has a thickness in the range 4000 Å to 12000 Å. The lower insulating layer 106a may be made of a material selected from a group consisting of $SiO_2$, USG, BPSG, and PSG, or a combination thereof, by using a CVD (chemical vapor deposition) process, a reflow process, a deposition/etching process, or a HDP (high density plasma) process. Alternatively, the lower insulating layer 106a may be made of a material selected from o a group consisting of SiOF, FOX (flowable oxide), and polymer, or a combination thereof, by using a SOG (spin on glass) process or spin coating process.

The upper insulating layer 106b is preferably made of a material having a high hardness relative to the lower insulating layer 106a, and preferably has a thickness in the range of 100 Å to 10000 Å. The upper insulating layer 106b may be made of, for example, a material selected from a group consisting of SiN, SiON, AlN, $Al_2O_3$, BN, and diamond-like carbon, or a combination thereof. It is one of the most important keys that the upper insulating layer 106b having relatively high hardness is used to etch a low-step portion of the lower insulating layer 106a at a slow speed during a following planarization-etching step.

Substantially, the insulating layer 106 is formed having an uneven surface corresponding to the topology of the gate electrode 104, and a region where the gate electrode 104 is formed has a relatively high step compared to a region where the gate electrode is not formed.

With reference to FIG. 2b, the insulating layer 106 is etched until at least one of the diffusion regions is exposed, and thereby a contact hole 108 is formed.

As shown in FIG. 2c, a conductive layer 110 for forming contact plugs is deposited over the upper insulating layer 106b, having a thickness (for example, 3000 Å to 5000Å) enough to fill up the contact hole 108. The conductive layer 110 is made of a material selected from a group consisting of W, Al, Cu, Ti, TiN, polysilicon, W—Si, Al—Cu, and Al—Cu—Si by using a CVD, PVD, reflow, or force fill process.

In the first embodiment, the conductive layer 110 is formed directly on the upper insulating layer 106b filling up the contact hole 108, while in a modification of the first embodiment, a barrier layer (not shown) may be formed directly on the upper insulating layer 106b and on both sidewalls and a bottom of the contact hole 108, and then the conductive layer 110 can be formed over the barrier layer filling up the contact hole 108. The barrier layer may be made of a material from a group consisting of Ti, TiN, Ta, TaN, WN, TiSiN, and a combination thereof so as to improve contact resistance and adhesion characteristics and to suppress mutual reaction.

Referring to FIG. 2d, the conductive layer 110 is etched until an upper surface of the upper insulating layer 106b is exposed, to thereby form a contact plug 110a. The etching process of the conductive layer is performed by a CMP process or an etch-back process using a wet or a dry etch. When the CMP process is performed to etch the conductive layer 110, a polishing material is used wherein a polishing speed ratio of the conductive layer 110 to the insulating layer 106 is in the range from (1: several hundreds) to (several hundreds: 1). Preferably, a polishing material is used such that a polishing speed of the conductive layer 110 of, for example, polysilicon is five times as high as that of the lower insulating layer 106 of, for example, oxide or that of the upper insulating layer of, for example, nitride (SiN or SiON).

Figure 3:
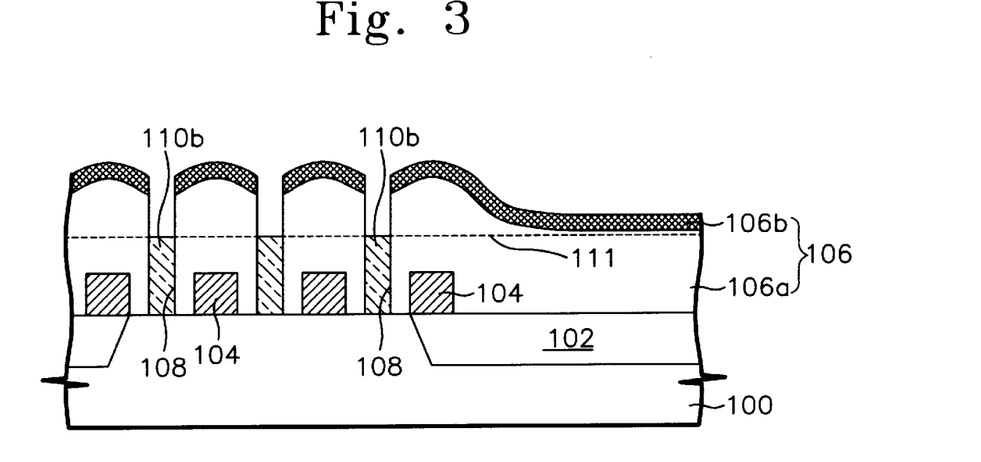
FIG. 3 is a cross-sectional view showing a recessed contact plug which is fabricated according to the first embodiment of the present invention.

Alternatively, in case that the etch-back process is performed to etch the conductive layer 110, if the conductive layer 110 that fills up the contact hole 108 is sufficiently over-etched, a recessed contact plug 100b is formed as shown FIG. 3. This figure shows the recessed contact plug 110b formed according to another modification of the first embodiment. The recessed contact plug 110b may be used as an etch stopper layer during a following planarization/etching process of the insulating layer 106.

Figure 2E:
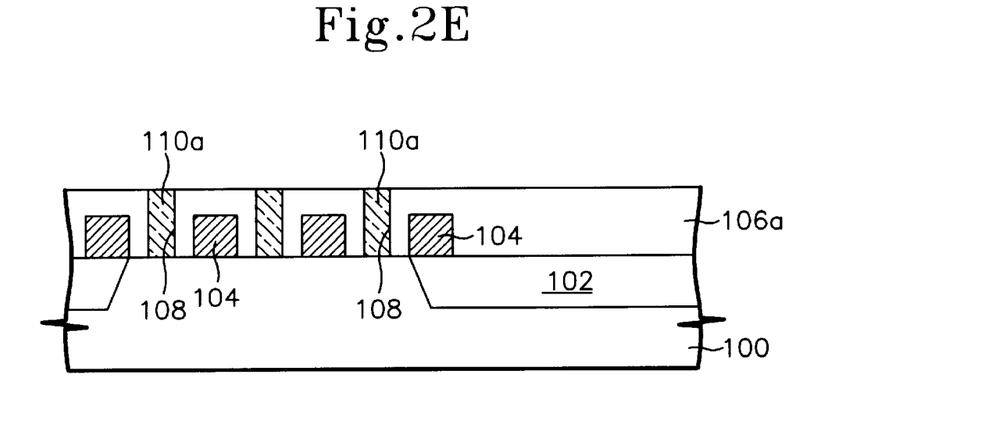

Finally, as shown in FIG. 2e, a planarization/etching process of CMP is performed to planarize the insulating layer 106 and the contact plug 110a. During the CMP process, the upper insulating layer 106b is removed and an upper surface of the lower insulating layer 106a is planarized. As a result, the contact plug 110a or 110b is formed which has an even surface having the same horizontal position as the upper surface of the lower insulating layer 106a. The CMP process is preferably performed using a polishing material wherein a polishing speed ratio of the conductive layer 110 to the insulating layer 106 is in the range from (1: several hundreds) to (several hundreds: 1).

Alternatively, when the recessed contact plug 110b is formed, the CMP process for planarization of the insulating layer 106 can be is performed using the recessed contact plug 110b as an etch stopper layer, as depicted by a dotted line 111 of FIG. 3.

Since a relatively high-step portion of the insulating layer 106 where the gate electrode 104 and the contact hole 108 are formed is planarized/etched at a polishing speed higher than a portion where they are not formed, planarization of the insulating layer 106 can be easily achieved. Also, since the upper insulating layer 106b having a relatively high hardness compared to the lower insulating layer 106a is etched at a polishing speed slower than the lower insulating layer 106a, an efficient planarization of the insulating layer 106 can be obtained. As a result, the lower insulating layer 106a which may be used as an interlayer insulating layer between interconnections can be considerably reduced in thickness as compared with an insulating layer of the prior art semiconductor device.

On the other hand, the conductive layer 110 and the insulating layer 106 may be simultaneously planarized/etched by using the CMP process. In this case, the CMP process is performed using a polishing material for etching an oxide layer, namely a polishing material having non-selectivity to sequentially etch the conductive layer 110 of polysilicon, the upper insulating layer 106b of nitride, and the lower insulating layer 106a of oxide.

Subsequently, an upper interconnection (not shown) is formed to electrically connect with the contact plug 110a or 110b. According to the first embodiment of the invention, since a conductive material is not trapped which is deposited to form a contact plug on the upper surface of the planarized insulating layer 106, a bridge between interconnections cannot be generated even though the interconnections are formed on the insulating layer.

EMBODIMENT 2

Hereinafter, a method for forming contact plugs of a semiconductor memory device according to a second embodiment of the present invention will be described with reference to FIGS. 4 and 5.

Referring to FIG. 4a, a metal interconnection 202 is formed on a semiconductor substrate 200, for example, a silicon substrate whose active and inactive regions are defined. The metal interconnection 202 is formed on the active region.

Alternatively, although not shown, an insulating layer having a thickness of 4000 Å to 20000 Å may be deposited over the silicon substrate 200 on which a gate electrode (not shown) is formed, and then the metal interconnection 202 may be formed on the insulating layer.

Next, an insulating layer 204 is deposited over the silicon substrate 200 including the metal interconnection 202 so as to permit electrical insulation between interconnections. The insulating layer 204 can be made of a material selected from a group consisting of $SiO_2$, USG, BPSG, PSG, SiN, SiON, SiOF, SOG, FOX, polymer, and a combination thereof. Preferably, the insulating layer 204 is a multi-layer film, that is, a lower insulating layer 204a and an upper insulating layer 204b which have a different hardness with respect to each other. The lower insulating layer 204a is made of an oxide layer which preferably has a thickness in the range 10000 Å to 30000 Å. The lower insulating layer 204a may be made of a material selected from a group consisting of $SiO_2$, USG, BPSG, and PSG, or a combination thereof, by using a CVD process, a reflow process, a deposition/etching process, or HDP process. Alternatively, the lower insulating layer 204a may be made of a material selected from a group consisting of SiOF, FOX, and polymer, or a combination thereof, by using a SOG process or spin coating process.

The upper insulating layer 204b is made of a material having a relatively high hardness with respect to the lower insulating layer 204a, and preferably has a thickness in the range of 100 Å to 1000 Å. The upper insulating layer 204b may be made of, for example, a material selected from a group consisting of SiN, SiON, AlN, $Al_2O_3$, BN, and diamond-like carbon, or a combination thereof. The upper insulating layer 204b is used to etch a low-step portion of the lower insulating layer 204a at a slow speed during a following planarizing/etching step.

Substantially, the insulating layer 204 is formed having an uneven surface along the topology of the metal interconnection 202, and a region where the metal interconnection 202 is formed has a relatively high step to a region compared where the metal interconnection is not formed.

With reference to FIG. 4b, the insulating layer 204 is etched until at least one metal interconnection 202 is exposed, and thereby a contact hole 206 is formed.

As shown in FIG. 4c, a barrier layer 207 is formed directly on the upper insulating layer 204b and on both sidewalls and a bottom of the contact hole 206. The barrier layer 207 is made of a material selected from a group consisting of Ti, TiN, Ta, TaN, WN, TiSiN, and a combination thereof so as to improve contact resistance and adhesion characteristics and to suppress a mutual reaction between the metal interconnection 202 and a conductive material used as a contact plug. Next, a conductive layer 208 for forming contact plugs is deposited over the barrier layer 207, having a thickness (for example, 2000 Å to 6000 Å) enough to fill up the contact hole 206. The conductive layer 208 is made of a material selected from a group consisting of W, Al, Cu, Ti, TiN, polysilicon, W—Si, Al—Cu, and Al—Cu—Si by using CVD, PVD, reflow, or force fill process.

Referring to FIG. 4d, the conductive layer 208 and the barrier layer 207 are sequentially etched until an upper surface of the upper insulating layer 204b is exposed, to thereby form a contact plug 208a. The etching process of the conductive layer 208 and the barrier layer 207 is performed by a CMP process or an etch-back process using wet or dry etch. When the CMP process is performed to etch the conductive layer 208, a polishing material is used wherein a polishing speed ratio of the conductive layer 208 to the insulating layer 204 is in the range from (1: several hundreds) to (several hundreds: 1). Preferably, the polishing material is used wherein a polishing speed of the conductive layer 208 of tungsten (W) is five times or more as high as that of the lower insulating layer 204 of oxide or that of the upper insulating layer of nitride (SiN or SiON).

Figure 5:
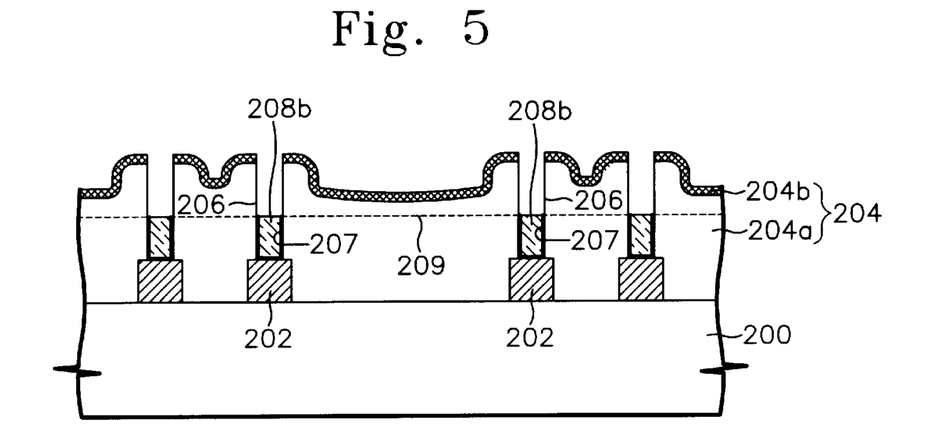
FIG. 5 is a cross-sectional view showing a recessed contact plug which is fabricated according to the second embodiment of the present invention.

Alternatively, in the case that the etch-back process is performed to etch the conductive layer 208, if the conductive layer 208 filling up the contact hole 206 is sufficiently over-etched, a recessed contact plug 208b is formed as shown FIG. 5. This figure shows the recessed contact plug 208b formed according to a modification of the second embodiment. The recessed contact plug 208b can be used as an etch stopper layer during a following planarization/etching process of the insulating layer 204.

Figure 4E:
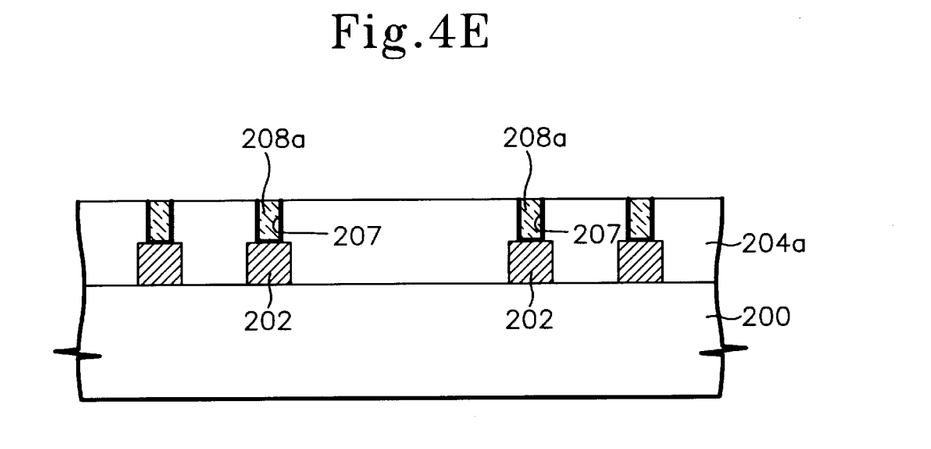

Finally, as shown in FIG. 4e, a planarization/etching process of CMP is performed to planarize the insulating layer 204 and the contact plug 208a. During the CMP process, the upper insulating layer 204b is removed and an upper surface of the lower insulating layer 204a is planarized. As a result, the contact plug 208a or 208b is formed which has an even surface having the same horizontal position as the upper surface of the lower insulating layer 204a. The CMP process is preferably performed using a polishing material wherein a polishing speed ratio of the conductive layer 208 to the insulating layer 204 is in the range from (1: several hundreds) to (several hundreds: 1).

Alternatively, when the recessed contact plug 208b is formed by the over-etching process, the CMP process for planarization of the insulating layer 204 is performed using the recessed contact plug 208b as an etch stopper layer, as depicted by a dotted line 209 of FIG. 5. It is preferably that the CMP process uses a polishing material wherein a polishing speed ratio of the conductive layer 208 to the insulating layer 204 is 1:10.

Similarly to the first embodiment, since a relatively high-step portion of the insulating layer 204 where the metal interconnection 202 and the contact hole 206 are formed is planarized/etched at a polishing speed higher than a portion where they are not formed, planarization of the insulating layer 204 can be easily achieved. Also, since the upper insulating layer 204b having a relatively high hardness compared to the lower insulating layer 204a is etched at a polishing speed slower than the lower insulating layer 204a, an efficient planarization of the insulating layer 204 can be obtained. As a result, the lower insulating layer 204a which may be used as an insulating layer between interconnections can be considerably reduced in thickness as compared with an insulating layer of the prior art semiconductor device.

On the other hands, the conductive layer 208 and the insulating layer 204 may be simultaneously planarized/etched by using the CMP process. In this case, the CMP process is performed using a polishing material for etching an oxide layer, namely a polishing material having non-selectivity to sequentially etch the conductive layer 208 of tungsten, the barrier layer 207, the upper insulating layer 204b of nitride, and the lower insulating layer 204a of oxide.

Subsequently, an upper interconnection (not shown) is formed to electrically connect with the contact plug 208a or 208b. According to the second embodiment of the invention, since a conductive material is not trapped which is deposited to form a contact plug on the upper surface of the planarized insulating layer 204, a bridge between interconnections cannot be generated even though the upper interconnection is formed.

As is apparent from the foregoing, the present invention provides the advantage of contact plugs, that can prevent the formation of a bridge between interconnections which can be caused due to a scratch on the upper surface of an insulating layer. This is because a CMP process for forming the contact plugs is carried out after a CMP process for planarizing the insulating layer.

Furthermore, since the insulating layer includes two layers, a lower insulating layer and an upper insulating layer having a relatively high hardness compared to the lower insulating layer, a high-step region where a conductive structure is formed and a low-step region where the conductive is not formed are efficiently planarized. Therefore, the present invention provides the further advantage that a thickness of the insulating layer can be considerably reduced.

What is claimed is:

1. A method for forming contact plugs of a semiconductor device, comprising the steps of:

forming a conductive structure over a semiconductor substrate having a plurality of diffusion regions therein;

forming an insulating layer over the semiconductor substrate and the conductive structure;

etching the insulating layer until at least one of the diffusion regions is exposed, to form a contact hole;

depositing a conductive layer over the insulating layer and filling up the contact hole with the conductive layer before the insulating layer is planarized;

etching the conductive layer until an upper surface of the insulating layer is exposed, to form a contact plug; and etching an upper surface of the insulating layer including the contact plug by carrying out a planarization/etching process to thereby planarize both the upper surface of the contact plug and the upper surface of the insulating layer after deposition of the conductive layer, whereby bridging of conductive material from the contact hole across upper surface of the insulating layer is suppressed, wherein the step of etching the conductive layer overetches the conductive layer to form a recessed contact plug, and wherein the recessed contact plug is used as an etching stopper layer during the planarization-etching process.

2. The method according to claim 1, wherein said insulating layer is made of at least one material selected from the group consisting of SiO$_2$, USG (undoped silicate glass), BPSG (borophospho silicate glass), PSG (phospho silicate glass), SiN, SiON, SiOF, SOG (spin on glass), FOX (flowable oxide), polymer, and a combination thereof.

3. The method according to claim 1, wherein said conductive layer is made of the material selected from a group consisting of W, Al, Cu, Ti, TiN, polysilicon, W—Si, Al—Cu, and Al—Cu—Si by means of one of a CVD process, a PVD process, a reflow process, and a force fill process.

4. The method according to claim 1, wherein the step of etching the conductive layer is performed by the process selected from a group consisting of an etch-back process and a chemical-mechanical polishing (CMP) process.

5. The method according to claim 4, wherein said etch-back process is performed by one of a wet and dry etch process.

6. The method according to claim 4, wherein said CMP process is performed using a polishing material, and wherein a polishing speed ratio of the conductive layer to the insulating layer is in the range of from (several hundred:1) to (1:several hundred).

7. The method according to claim 1, wherein said planarizing/etching process is performed using a polishing material, and wherein a polishing speed ratio of the conductive layer to the insulating layer is in the range from (1:several hundred) to (several hundred:1).

8. The method according to claim 1, further comprising the step, performed before the formation of the conductive layer, of forming a barrier layer over the insulating layer and the contact hole.

9. The method according to claim 8, wherein said barrier layer is made of at least one material selected from the group consisting of Ti, TiN, Ta, TaN, WN, TiSiN, and a combination thereof.

10. A method for forming contact plugs of a semiconductor device, comprising the steps of:

forming a conductive structure over a semiconductor substrate having a plurality of diffusion regions therein;

sequentially forming first and second insulating layers over the semiconductor substrate and the conductive structure, the second insulating layer having a hardness higher than that of the first insulating layer;

sequentially etching the second and first insulating layers until at least one of the diffusion regions and the conductive structure is exposed, to form a contact hole;

forming a conductive layer over the second insulating layer and filling up the contact hole before the insulating layers are planarized/etched;

etching the conductive layer until at least an upper surface of the second insulating layer is exposed, to form a contact plug; and planarizing/etching the second and first insulating layers and the contact plug, wherein a high-step portion of the second insulating layer formed over the conductive structure and the contact hole is etched at a speed higher than a low-step portion of the second insulating layer where the conductive structure and the contact hole are not formed during the planarizing/etching step, wherein the second insulating layer is etched at a speed slower than the first insulating layer, during the planarization/etching step, and wherein the step of etching the conductive layer overetches the conductive layer to form a recessed contact plug, and wherein the recessed contact plug is used as an etching stopper layer during the planarization-etching step.

11. The method according to claim 10, wherein said first insulating layer is made of at least one material selected from the group consisting of SiO$_2$, USG, BPSG, PSG, SiOF, FOX, and a polymer, and said second insulating layer is made of at least one material selected from a group consisting of SiN, SiON, AlN, Al$_2$O$_3$, BN, and diamond-like carbon.

12. The method according to claim 10, wherein said conductive layer is made of at least one material selected from the group consisting of W, Al, Cu, Ti, TiN, polysilicon, W—Si, Al—Cu, and Al—Cu—Si by means of one of a CVD process, a PVD process, a reflow process, and a force fill process.

13. The method according to claim 10, wherein the step of etching the conductive layer is performed by the process selected from a group consisting of an etch-back process and a chemical-mechanical polishing (CMP) process.

14. The method according to claim 13, wherein the etch-back process is performed by one of a wet etch process and a dry etch process.

15. The method according to claim 13, wherein said CMP process is performed using a polishing material, and wherein a polishing speed ratio of the conductive layer to the first insulating layer and the second insulating layer is in the range from (1:several hundreds) to (several hundreds:1).

16. The method according to claim 10, wherein said planarizing/etching process is performed by means of a chemical-mechanical polishing (CMP) process using a polishing material for which a polishing speed ratio of the first insulating layer to the second insulating layer is in the range from (1:several hundred) to (several hundred:1).

17. The method according to claim 10, further comprising the step, performed before the formation of the conductive layer, of forming a barrier layer over the second insulating layer and the contact hole.

18. The method according to claim 17, wherein said barrier layer is made of at least one material selected from the group consisting of Ti, TiN, Ta, TaN, WN, TiSiN, and a combination thereof.

19. A method for forming contact plugs of a semiconductor device, comprising the steps of:

forming a conductive structure over a semiconductor substrate having a plurality of diffusion regions therein;

sequentially forming first and second insulating layers over the semiconductor substrate and the conductive structure, said second insulating layer having a hardness higher than that of the first insulating layer;

sequentially etching the second and first insulating layers until at least one of the diffusion regions and the conductive structure is exposed, to form a contact hole;

forming a conductive layer over the second insulating layer and filling up the contact hole before the insulating layers are planarized/etched; and sequentially planarization/etching the conductive layer, the second insulating layer, and the first insulating layer to form a contact plug and to planarize the first insulating layer, wherein a high step portion of the second insulating layer containing the conductive structure and the contact hole is etched at a speed higher than a low-step portion of the second insulating layer where the conductive structure and the contact hole are not formed, wherein the second insulating layer is etched during the planarization/etching step at a speed slower than the first insulating layer, and wherein the step of sequentially planarization-etching the conductive layer, the second insulating layer, and the first insulating layer, over-etches the conductive layer to form a recessed contact plug, and wherein the recessed contact plug is used as an etching stopper layer during the planarization-etching step.

20. The method according to claim 19, further comprising the step, performed before the formation of the conductive layer, of forming a barrier layer over the second insulating layer and the contact hole.

21. The method according to claim 20, wherein said barrier layer is made of the material selected from a group consisting of Ti, TiN, Ta, TaN, WN, and TiSiN, and a combination thereof.

* * * * *